United States Patent
Hsu

(10) Patent No.: US 7,391,274 B2
(45) Date of Patent: Jun. 24, 2008

(54) LOW VOLTAGE OPERATING RING OSCILLATOR WITH ALMOST CONSTANT DELAY TIME

(75) Inventor: Jenshou Hsu, Hsin-chu (TW)

(73) Assignee: Etron Technology, Inc, Hsin-Chu (TW)

( * ) Notice: Subject to any disclaimer, the term of this patent is extended or adjusted under 35 U.S.C. 154(b) by 127 days.

(21) Appl. No.: 11/093,619

(22) Filed: Mar. 30, 2005

(65) Prior Publication Data

US 2006/0226921 A1    Oct. 12, 2006

(51) Int. Cl.
*H03L 7/099* (2006.01)

(52) U.S. Cl. .......................... 331/57; 331/185
(58) Field of Classification Search ................. 331/57, 331/185, 186
See application file for complete search history.

(56) References Cited

U.S. PATENT DOCUMENTS

| | | | |
|---|---|---|---|
| 5,898,343 A | 4/1999 | Morgan | 331/57 |
| 6,188,293 B1 | 2/2001 | Miyagi et al. | 331/57 |
| 6,229,403 B1 * | 5/2001 | Sekimoto | 331/57 |
| 6,566,970 B2 * | 5/2003 | Ingino, Jr. | 331/57 |
| 6,809,603 B1 * | 10/2004 | Ho | 331/57 |
| 6,813,210 B2 | 11/2004 | Okamoto et al. | 365/222 |

* cited by examiner

*Primary Examiner*—Robert J. Pascal
*Assistant Examiner*—James E Goodley
(74) *Attorney, Agent, or Firm*—Saile Ackerman LLC; Stephen B. Ackerman

(57) ABSTRACT

Methods and circuits for chain ring oscillators having a constant delay time over variations of temperature and variations of semiconductor manufacturing process while requiring low operating voltage only have been disclosed. A system current source includes a constant voltage circuit generating a constant voltage and hence a constant current via a resistance element. Main parts of the constant voltage circuit are an operational amplifier and a bandgap reference circuit. Using a series of current mirrors the constant currents are mirrored to current sources contained in each of n-inverter stages of the chain ring oscillator.

13 Claims, 3 Drawing Sheets

FIG. 1 – Prior Art

LOW VOLTAGE OPERATING RING OSCILLATOR WITH ALMOST CONSTANT DELAY TIME

BACKGROUND OF THE INVENTION (1) Field of the Invention

This invention relates generally to ring oscillator circuits and relates more particularly to a ring oscillator with almost constant delay time even if the operating voltage drops down.

(2) Description of the Prior Art

Ring oscillators are used for a variety of purposes. Usually ring oscillators are used as an internally generated clocking source, or as a stage in a more complex system such as a voltage controlled oscillator (VCO) or a phase locked loop (PLL). They are often used to issue a refresh command for e.g. DRAM memory devices.

For many applications, e.g. memory circuit design, a circuit having a constant delay is very important.

FIG. 1 prior art shows a circuit diagram of a 5-stage CMOS inverter chain ring oscillator. Normally the number of stages is an odd number (3, 5, 7, or ...) with the output of the cascade fed back to the input of the inverter chain. An oscillator provides an output at a specific frequency with no input signal required.

All these five inverter stages IN1 to IN5 have an identical circuit configuration. The first stage IN1 is equipped with a CMOS inverter INV1 comprising a PMOS transistor PI1 and an NMOS transistor NI1. Furthermore a PMOS transistor PN1 and a NMOS transistor NN1 provide a current source for this inverter stage IN1. The other stages IN2 to IN5 are equipped identically.

The output of the last stage IN5 is the input INP1 of the first inverter INV1. This input INP1 is connected to the gates of the CMOS transistors PI1 and NI1. The output OUT1 of the first inverter INV1 is connected to the drain of PMOS transistor PI1, to the drain of NMOS transistor NI1 and the input of the second inverter stage IN2.

The PMOS transistor PI1 has its source connected to the operating voltage VCC via PMOS transistor PN1. The NMOS transistor NI1 has its source connected to VSS voltage via NMOS transistor NN1.

The current I1 from voltage VCC to VSS through PMOS transistor P1, resistor R1 and NMOS transistor N1 follows the equation $$I1 = \frac{VP - VN}{R1},$$

wherein VP is the voltage at the drain of transistor P1 and VN is the voltage at the drain of transistor N1. The current I1 is mirrored to the first inverter stage via the current mirrors P1/PN1 and N1/NN1. Accordingly current I1 is mirrored to the other inverter stages as well. In case the operating voltage VCC drops down, the voltage difference VP-VN becomes very small. Especially in the light of new semiconductor technologies (most fabs moved for the most advanced ICs from 0.18 micron to 0.13 microns) the typical operating voltages used to turn the transistors on and off have been reduced from e.g. 2.5 volts to 1.8 volts, the circuits are becoming more sensitive in case of variations during the manufacturing process or in case of changing temperatures. Even if all devices are within manufacturing specifications PMOS devices have a higher speed than normal if the threshold voltage is lower than normal and vice versa the speed of NMOS devices is lower than normal if their threshold voltage is higher than normal.

This means that in case the threshold voltage of the PMOS or NMOS devices is higher than normal the difference of voltages VP and VN will be smaller. Vice versa the difference of voltages VP and VN will be larger if the threshold voltage of the PMOS or NMOS devices is lower than normal. Furthermore the semiconductor devices and resistor R1 depend in their performance upon changes of temperature. Therefore the current I1 and, by mirroring, the currents through the inverter stages IN1 to IN5 will be not constant but vary dependent upon the temperature and upon manufacturing process variations. Thus the delay time of the prior art ring oscillator will vary upon different temperatures and different manufacturing process parameters, even if these parameters are within specifications and even if the operating voltage VCC is regulated.

Since voltage VP>VN and voltage VP equals $$VP = VCC - |V_{THP1}|,$$

wherein $|V_{THP1}|$ is the threshold voltage of P1, and voltage $$VN \cong V_{THN1},$$

wherein $V_{THN}1$ is the threshold voltage of N1, the following equation is valid:

$$VCC = |V_{THP1}| + V_{THN1} + I1 \times R1.$$

Accordingly the ring oscillator shown in FIG. 1 prior art can only work precisely if the voltage difference I1×R1 is much larger than the sum of the threshold voltages $|V_{THP1}| + V_{THN1}$ There are known patents to control the delay time of ring oscillators:

U.S. Pat. No. 6,813,210 to Okamoto et al. teaches a semiconductor memory device including a refresh timer for determining a refresh cycle of self-refresh operation. The refresh timer includes a voltage regulator, a ring oscillator and a counter. The voltage regulator generates a bias voltage having positive temperature characteristics. The ring oscillator varies an oscillation cycle of a pulse signal according to the bias voltage. The counter counts a prescribed number of pulse signals and generates a refresh signal for executing refresh operation. The semiconductor memory device thus varies the refresh cycle according to a temperature change, and executes refresh operation with an appropriate refresh cycle.

U.S. Pat. No. (6,188,293 to Miyagi et al.) discloses a low-power consumption integrated ring oscillator capable of stable operation throughout a wide voltage range without undergoing a large frequency change including a first constant voltage generating circuit having an enhancement mode P-MOS transistor and a depletion mode N-MOS transistor and a second constant voltage generating circuit having a depletion mode N-MOS transistor and an enhancement mode N-MOS transistor. A first constant voltage generated by the first constant voltage circuit is applied to a gate electrode of a P-MOS transistor of transmission gates connected between respective cascaded inverters of the ring oscillator. A second constant voltage generated by the second constant voltage generating circuit is connected to the gate electrode of an N-MOS transistor of the transmission gates. By this construction, current consumption is reduced and battery lifetime can be increased. The boosting circuit for writing and erasing an EEPROM circuit may be formed with the low power ring oscillator.

U.S. Pat. No. (5,898,343 to Morgan) discloses a refresh circuit of a memory device including a ring oscillator with a frequency stabilizing circuit. The frequency stabilizing circuit produces compensated voltage signals in response to changes in supply voltage and temperature to modify the conductances of field-effect transistors of the frequency stabilizing circuit to compensate the conductive path of the discharge current of a capacitor from the ring oscillator in order to stabilize the oscillation frequency.

SUMMARY OF THE INVENTION

A principal object of the present invention is to achieve a ring oscillator having a constant delay time requiring a low operating voltage.

In accordance with the objects of this invention a method to achieve a constant delay time of ring oscillators requiring a low operating voltage has been accomplished. The method invented comprises, first, the provision of a chain ring oscillator comprising a system current source circuit comprising three branches, wherein a first branch comprises a constant voltage circuit and a resistance element and each of the second and third branches comprises two transistors, a system voltage supply $V_{CC}$, and n stages, wherein each of the stages of said ring oscillator has a first and a second current source and an inverter circuit. The following steps of the method invented are to use said constant voltage circuit to generate in said first branch a first constant current, which is defined by the voltage generated by said constant voltage circuit and said resistance element, to mirror said first constant current to a first transistor of said second branch of said system current source circuit in order to generate a second constant current, and to mirror said second constant current to a second transistor of said third branch in order to generate a third constant current and to each of said second current sources of each of said stages of said ring oscillator. The last step is to mirror said third constant current to each of said first current sources of each of said stages of said ring oscillator.

In accordance with the objects of this invention a chain ring oscillator having a constant delay time requiring a low operating voltage has been accomplished. The chain ring oscillator comprises, first, n identical cascaded stages of inverters, wherein each stage comprises a first and a second stage current source, wherein each of said stage current sources receives a current from a system current source, and an inverter circuit. Furthermore the circuit comprises a system supply voltage, and said system current source generating for each of said two current sources of all said n inverter stages a constant current, wherein said system current source comprises a constant voltage circuit.

BRIEF DESCRIPTION OF THE DRAWINGS

In the accompanying drawings forming a material part of this description, there is shown.

DESCRIPTION OF THE PREFERRED EMBODIMENTS

The preferred embodiments disclose methods and circuits for a CMOS chain ring oscillator having a constant delay time over variations of temperature and of manufacturing process variations.

Figure 2:
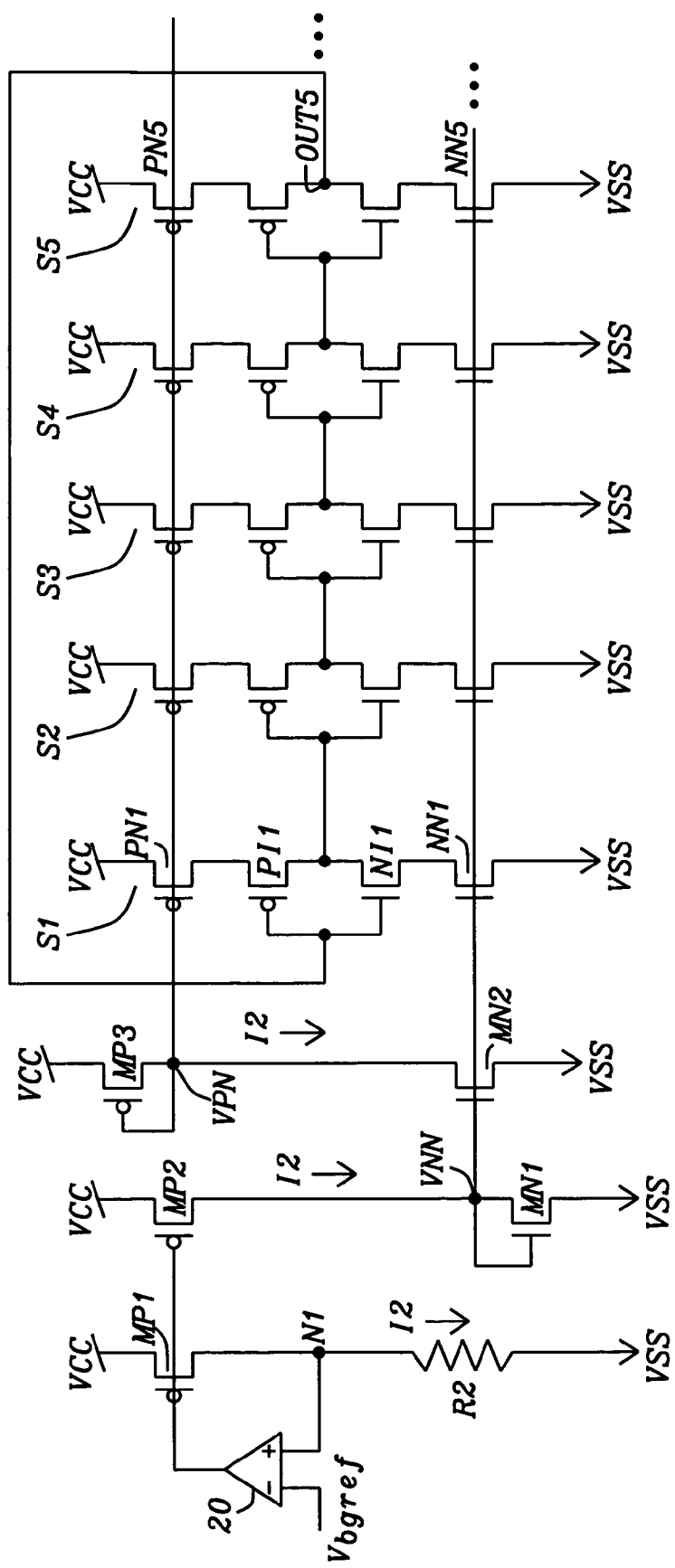
FIG. 2 shows a circuit diagram of a preferred embodiment of a chain ring oscillator according the present invention.

FIG. 2 shows a circuit diagram of a preferred embodiment of the present invention. This preferred embodiment shows a ring oscillator having five inverter stages S1 to S5. It has to be understood that the ring oscillator shown in FIG. 2 is a non-limiting example. The present invention supports any ring oscillators having any odd number (3, 5, 7, etc . . . ) of inverter stages.

The present invention is characterized by having a system current source being constant upon different temperatures and upon different manufacturing process variations. In the preferred embodiment of FIG. 2 a constant system current source is implemented using a constant voltage circuit. This constant voltage circuit is based on the bandgap $V_{bgref}$ of a semiconductor; this is a well-known physical value.

The constant voltage circuit comprises an operational amplifier 20 having a positive and a negative input port. The bandgap reference voltage $V_{bgref}$, which is generated from a bandgap reference circuit, not shown in FIG. 2, is the negative input of the operational amplifier 20; the voltage at node N1 is the positive input port of the operational amplifier 20. The output of the operational amplifier 20 is connected to the gate of PMOS transistor MP1. The source of the PMOS transistor MP1 is connected to the operating voltage VCC, the drain of MP1 is connected to the node N1 and thus to the positive input of the operational amplifier 20. The operational amplifier controls the voltage at node N1 to the level of the bandgap reference voltage $V_{bgref}$. Thus the current I2 flowing through PMOS transistor MP1 is according to the equation:

$$I2 = \frac{N1}{R2} = \frac{V_{bgref}}{R2}.$$

The current I2 is constant over variations of transistor threshold voltages values and variations of temperature because resistor R2 and the bandgap reference voltage $V_{bgref}$ have constant values. The resistor R2 must have a constant resistance over variations of temperature. In a preferred embodiment of the invention a salicide resistor has been selected for R2.

The current through PMOS transistor MP1 is mirrored to PMOS transistor MP2. In the preferred embodiment described transistor MP2 has the same size as transistor MP1; this means the channel width of MP1 divided by the channel length of MP1 is equal to channel width of MP2 divided by the channel length of MP2. Usually both transistors MP1 and MP2 are identical. Thus in the preferred embodiment shown in FIG. 2 the same current I2 is flowing through PMOS transistor MP2 and NMOS transistor MN1 as through PMOS transistor MP1 and resistor R2.

It has to be understood that current mirror ratios other than 1.1 can be used for current mirror MP1/MP2 and for current mirror MN1/MN2. The current, which mirrors to transistor PN1, is not necessarily equal to the current that mirrors to transistor NN1. Even though the currents may be different they are constant currents.

The current through transistors MP2 and MN1 is mirrored again from transistor MN1 to MN2 and to NMOS transistors NN1 to NN5. In the preferred embodiment described here the current mirror ratio is 1:1 again, i.e. transistors MN1, MN2 and NN1 to NN5 have a same size. It has to be understood that transistors MN2 and NN1 to NN5 can also have a different size than transistor MN1.

The constant current I2 through PMOS transistor MP3 and NMOS transistor MN2 is mirrored from transistor MP3 to stage current sources PN1 to PN5 and respective the constant current through transistor MN1 is mirrored to stage current sources NN1 to NN5. Therefore a constant current is flowing through all inverter stages.

Thus the delay time of the circuit invented is, by regulating the voltage at both node N1 and at VCC level to constant levels, almost constant over variations of manufacturing process parameters or over variations of temperature.

Figure 1:
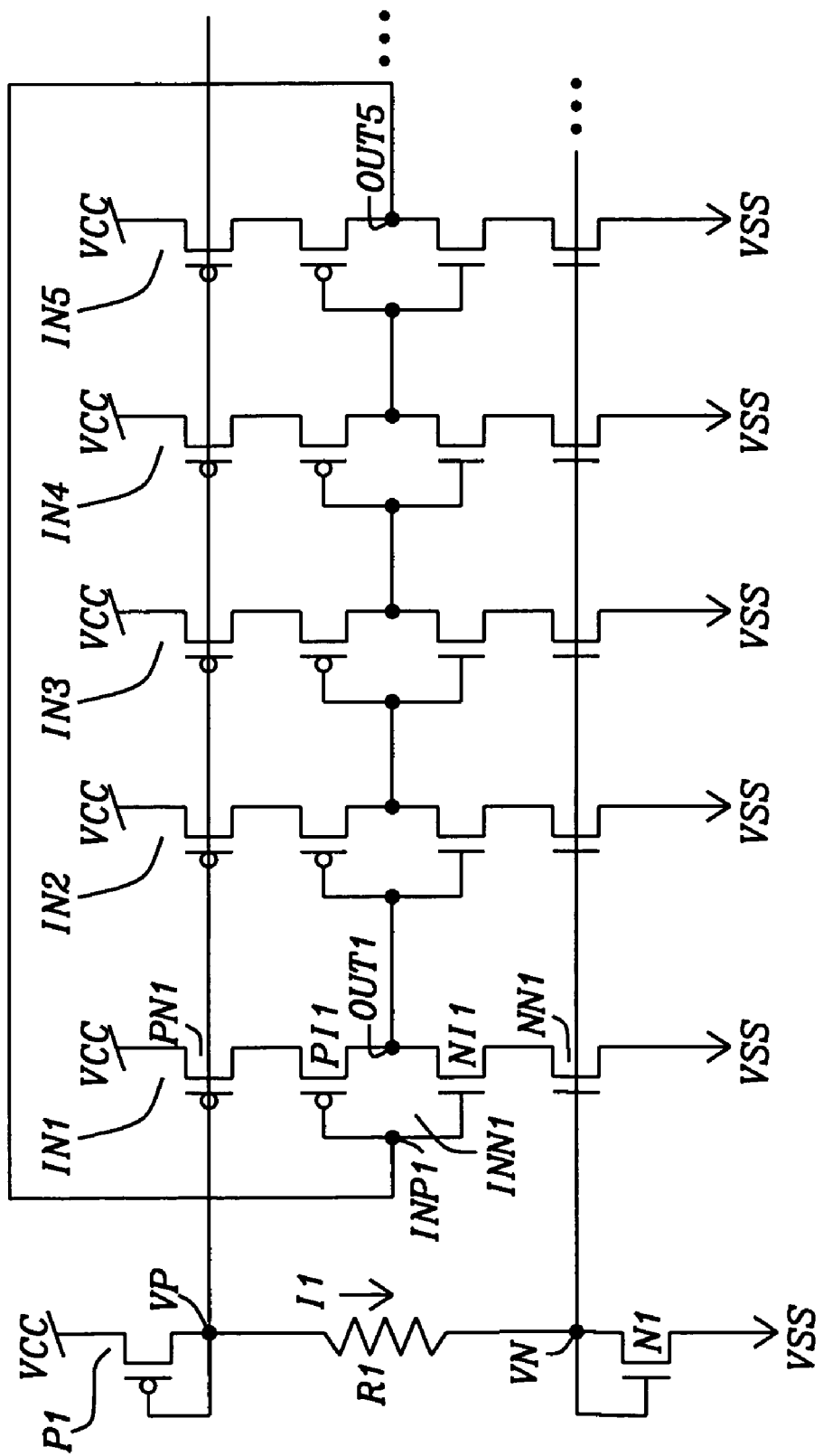
FIG. 1 prior art shows a circuit diagram of a chain ring oscillator

The tracking nodes VPN and VNN shown in FIG. 2 have a much larger voltage range than the nodes VP and VN shown in FIG. 1 prior art. Therefore the circuit of the present invention can work precisely under lower operating voltage. The circuit invented can work precisely if the operating voltage VCC is larger than VPN+$V_{DSMIN}$ (minimum drain-source voltage) of NMOS transistor MN2 or if VCC is larger than VNN+$V_{DSMIN}$ of PMOS transistor MP2, depending on which of both values is larger.

It has to be understood that the provision of a constant voltage and of constant currents according to the present invention applies for any kind of chain ring oscillators having any odd number of stages.

Figure 3:
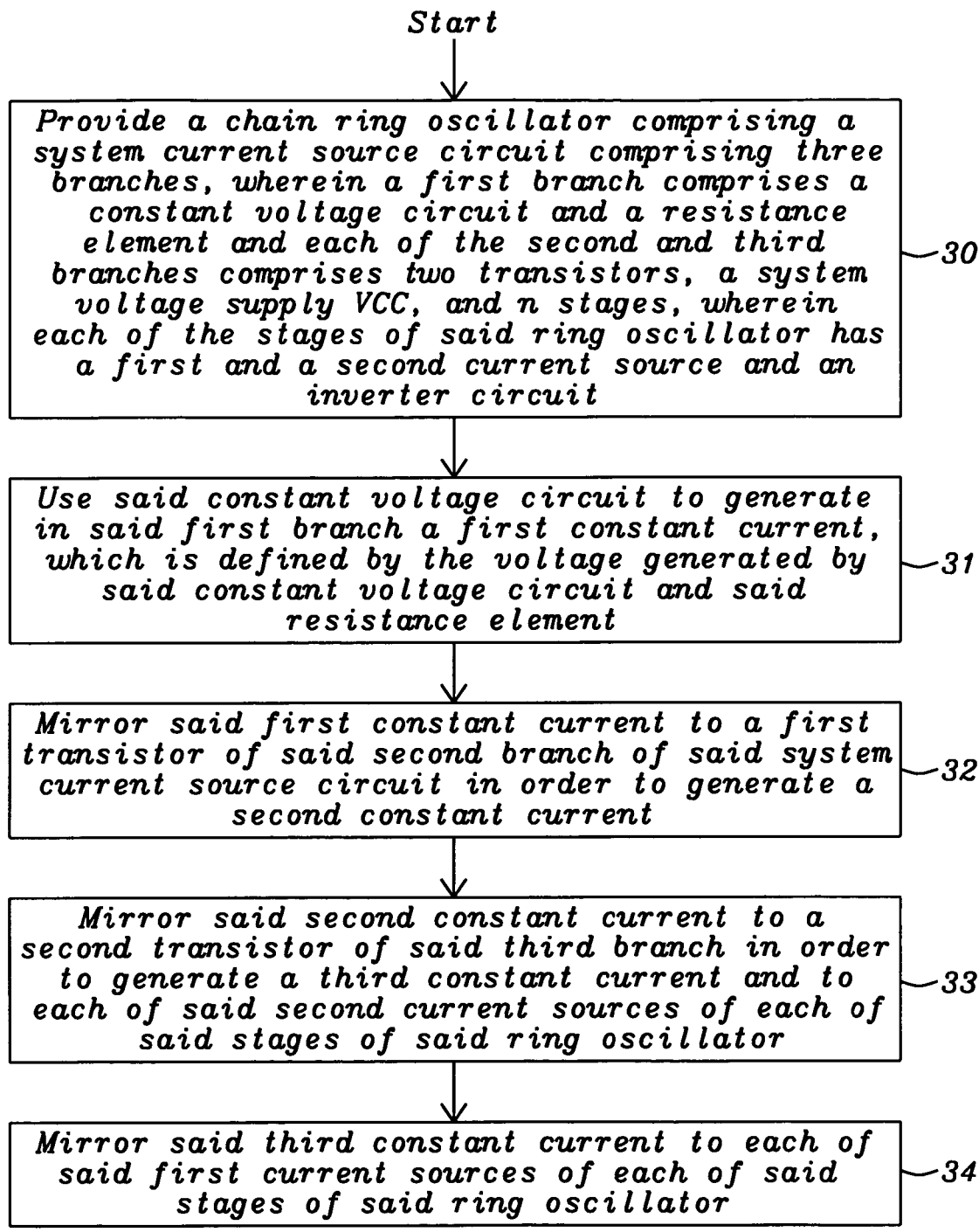
FIG. 3 shows a flowchart of a method invented to achieve a constant delay time of a ring oscillator having a low operating voltage.

FIG. 3 illustrates a flowchart of a method to achieve an almost constant delay time of a ring oscillator. Step 30 illustrates the provision of a chain ring oscillator comprising a system current source circuit comprising three branches, wherein a first branch comprises a constant voltage circuit and a resistance element and each of the second and third branches comprises two transistors, a system voltage supply $V_{CC}$, and n stages, wherein each of the stages of said ring oscillator has a first and a second current source and an inverter circuit. Any resistance element, having a constant resistance over temperature changes, could be used instead of a resistor. In a preferred embodiment of the invention a salicide resistor has been selected for this resistance element. Step 31 describes the usage of said constant voltage circuit to generate in said first branch a first constant current, which is defined by the voltage generated by said constant voltage circuit and said resistance element. In step 32 said first constant current is mirrored to a first transistor of said second branch of said system current source circuit in order to generate a second constant current. In step 33 said second constant current is mirrored to a second transistor of said third branch in order to generate a third constant current and to each of said second current sources of each of said stages of said ring oscillator. In the last step 34 said third constant current is mirrored to each of said first current sources of each of said stages of said ring oscillator.

While the invention has been particularly shown and described with reference to the preferred embodiments thereof, it will be understood by those skilled in the art that various changes in form and details may be made without departing from the spirit and scope of the invention.

What is claimed is:

1. A method to achieve a constant delay time of ring oscillators requiring a low operating voltage is comprising the steps of:

provide a chain ring oscillator comprising a system current source circuit comprising three branches, wherein a first branch comprises a resistance element and a constant voltage circuit comprising an operational amplifier, a bandgap reference circuit, providing input for said operational amplifier, and a transistor and each of the second and third branches comprises a PMOS transistor, an NMOS transistors, a system voltage supply $V_{CC}$, and n stages, wherein each of the stages of said ring oscillator has a first and a second current source and an inverter circuit and wherein a single-ended output of the inverter circuit of the n-th stage is fed back to the inverter circuit of a first stage;

use said constant voltage circuit to generate in said first branch a first constant current, which is defined by a voltage generated by said constant voltage circuit and said resistance element;

mirror said first constant current to said PMOS transistor of said second branch of said system current source circuit in order to generate a second constant current;

mirror said second constant current from said NMOS transistor of the second branch to said NMOS transistor of said third branch in order to generate a third constant current and to each of said second current sources of each of said stages of said ring oscillator; and mirror said third constant current from the PMOS transistor of the third branch to each of said first current sources of each of said stages of said ring oscillator.

2. The method of claim 1 wherein said system voltage supply $V_{CC}$ provides a regulated voltage.

3. The method of claim 1 wherein said mirroring of the first constant current to said second branch is performed by using a current mirror ratio of 1:1.

4. The method of claim 1 wherein said mirroring of said second constant current from said second branch to said third branch is performed by using a current mirror ratio of 1:1.

5. The method of claim 1 wherein said resistance element is a resistor.

6. The method of claim 1 wherein said resistance element is a salicide resistor.

7. A chain ring oscillator to achieve to achieve a constant delay time requiring a low operating voltage is comprising:

n identical cascaded stages of inverters, wherein each stage comprises a first and a second stage current source, wherein a current through said first current source is mirrored from a PMOS transistor of a third branch of a system current source, a current through said second current source is mirrored from an NMOS transistor of said third branch of said system current source, and an inverter circuit and wherein a single-ended output of the inverter circuit of the n-th stage is fed back to the inverter circuit of a first stage; and a system supply voltage; and said system current source having three branches, generating for each of said two current sources of all said n inverter stages a constant current, wherein said system current source comprises in a first branch a constant voltage circuit comprising an operational amplifier, a bandgap reference circuit, providing input for said operational amplifier, and a transistor, wherein a gate of said transistor is connected to a gate of a PMOS transistor of the second branch and a pate of an NMOS transistor of the second branch is connected to a gate of said NMOS transistor of the third branch.

8. The chain ring oscillator of claim 7 wherein said system current source comprises:

said first branch of said system comprising a constant voltage circuit is providing a node having a constant voltage and a resistance element, wherein one terminal of said element is connected to said node and the other terminal is connected to VSS voltage;

said second branch of said system current source comprising said PMOS transistor and said NMOS transistor wherein the source of said PMOS transistor is connected to VCC voltage, and the drain of said PMOS transistor is connected to the drain and to the gate of said NMOS transistor and the source of said NMOS transistor is connected to VSS voltage, wherein the current through said resistance element of the first branch is mirrored to said PMOS transistor of the second branch, and wherein the current through said NMOS transistor of the second branch is mirrored to said NMOS transistor of the third branch and to each of said second current sources of each of said n inverter stages; and said third branch of said system current source comprising said PMOS transistor and said NMOS transistor, wherein the source of said PMOS transistor is connected to VCC voltage, the gate and the drain of said PMOS transistor is connected to the drain of said NMOS transistor, the source of said NMOS transistor is connected to VSS voltage and the gate of said NMOS transistor is connected to the gate of NMOS transistor of the second branch.

9. The chain ring oscillator of claim 8 wherein said constant voltage circuit is comprising:

an operational amplifier having an output and a negative and a positive input, wherein the negative input is said bandgap reference voltage, the positive input is connected to said node providing a constant voltage and the output is connected to the gate of a PMOS transistor;

said PMOS transistor, wherein its source is connected to VCC voltage, its drain is connected to said node providing a constant voltage and its gate is connected to the gate of said first PMOS transistor of said first branch, wherein said PMOS transistor is used as means to mirror the current through said first branch; and said bandgap reference circuit, which generates said bandgap reference voltage connected to said negative input of said operational amplifier.

10. The chain ring oscillator of claim 8 wherein said resistance element is a resistor.

11. The chain ring oscillator of claim 10 wherein said resistor is a salicide resistor.

12. The chain ring oscillator of claim 7 wherein each of said first stage current sources of each of said inverter stages are PMOS transistors and each of said second current sources of each of said inverter stages are an NMOS transistors.

13. The chain ring oscillator of claim 7 wherein each of said inverter circuits comprised in each inverter stages comprises one PMOS transistor and one NMOS transistor, wherein the source of the PMOS transistor is connected via said first stage current sources to VCC voltage, the drain of said PMOS transistor is connected to the output of the related inverter stage and to the drain of the NMOS transistor, the gates of both said PMOS and NMOS transistors are connected and are the input of the related inverter stage, and the source of the NMOS transistor is connected via said second stage current source to VSS voltage.

* * * * *